United States Patent
Guo et al.

(10) Patent No.: US 12,400,845 B2
(45) Date of Patent: Aug. 26, 2025

(54) ION ENERGY CONTROL ON ELECTRODES IN A PLASMA REACTOR

(71) Applicant: Applied Materials, Inc., Santa Clara, CA (US)

(72) Inventors: Yue Guo, Redwood City, CA (US); Yang Yang, San Diego, CA (US); Haitao Wang, Fremont, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 551 days.

(21) Appl. No.: 17/537,107

(22) Filed: Nov. 29, 2021

(65) Prior Publication Data
US 2023/0170194 A1     Jun. 1, 2023

(51) Int. Cl.
*H01J 37/32* (2006.01)

(52) U.S. Cl.
CPC .... *H01J 37/3299* (2013.01); *H01J 37/32174* (2013.01); *H01J 37/32091* (2013.01); *H01J 2237/3341* (2013.01)

(58) Field of Classification Search
CPC ............. H01J 37/3299; H01J 37/32174; H01J 37/32091; H01J 2237/3341; H01J 37/32146; H01J 37/32568; H01J 37/32715
See application file for complete search history.

(56) References Cited

U.S. PATENT DOCUMENTS

| 6,095,084 A | * | 8/2000 | Shamouilian | H01J 37/32559 156/345.47 |
| 10,224,181 B2 | * | 3/2019 | Biloiu | H01J 37/32422 |

(Continued)

FOREIGN PATENT DOCUMENTS

| JP | 2010171320 A | 8/2010 |
| JP | 2017520909 A | 7/2017 |

(Continued)

OTHER PUBLICATIONS

International Search Report and Written Opinion for PCT/US2022/048631 dated Mar. 15, 2023.

(Continued)

*Primary Examiner* — Joshua L Allen
*Assistant Examiner* — Christopher Remavege
(74) *Attorney, Agent, or Firm* — Patterson + Sheridan, LLP (57) ABSTRACT

Embodiments provided herein generally include apparatus, plasma processing systems and methods for controlling ion energy distribution in a processing chamber. One embodiment of the present disclosure is directed to a method for plasma processing. The method generally includes: determining a voltage and/or power associated with a bias signal to be applied to a first electrode of a processing chamber, the voltage being determined based on a pressure inside a processing region of the processing chamber such that the voltage is insufficient to generate a plasma inside the chamber by application of the voltage and/or power to the first electrode; applying the first bias signal in accordance with the determined voltage and/or power to the first electrode; and applying a second bias signal to a second electrode of the processing chamber, wherein the second bias signal is configured to generate a plasma in the processing region and the first bias is applied while the second bias is applied.

18 Claims, 7 Drawing Sheets

(56) References Cited

U.S. PATENT DOCUMENTS

| | | | |
|---|---|---|---|
| 11,011,351 B2* | 5/2021 | Shoeb | H01L 21/67069 |
| 2011/0240599 A1* | 10/2011 | Honda | H01J 37/32091 |
| | | | 156/345.44 |
| 2012/0228124 A1* | 9/2012 | Veprek | C23C 14/22 |
| | | | 204/192.12 |
| 2015/0083580 A1* | 3/2015 | Shimizu | H01L 21/32137 |
| | | | 204/192.3 |
| 2017/0358431 A1* | 12/2017 | Dorf | H01J 37/32935 |
| 2019/0157040 A1* | 5/2019 | Fairbairn | H01J 37/32146 |
| 2019/0180982 A1 | 6/2019 | Brouk et al. | |
| 2019/0350072 A1* | 11/2019 | Dorf | C23C 14/3485 |
| 2020/0020510 A1* | 1/2020 | Shoeb | H01J 37/32183 |
| 2021/0313149 A1 | 10/2021 | Shoeb et al. | |
| 2021/0335606 A1* | 10/2021 | Dhas | C23C 16/509 |
| 2021/0343503 A1 | 11/2021 | Torii et al. | |
| 2021/0351007 A1* | 11/2021 | Carter | H01J 37/32422 |
| 2021/0398777 A1* | 12/2021 | Shiina | H01J 37/3244 |
| 2022/0157577 A1* | 5/2022 | Cui | H01J 37/32706 |

FOREIGN PATENT DOCUMENTS

| | | |
|---|---|---|
| JP | 2021503700 A | 2/2021 |
| JP | 2021158134 A | 10/2021 |
| KR | 20200086826 A | 7/2020 |
| TW | 201826318 A | 7/2018 |
| TW | 201923816 A | 6/2019 |
| WO | 2021178183 A1 | 9/2021 |
| WO | 2021178185 A1 | 9/2021 |

OTHER PUBLICATIONS

Taiwan Office Action issued to patent application No. 111141949 on Nov. 28, 2024.

Japan Office Action issued to patent application No. 2024-531025 on Apr. 15, 2025.

* cited by examiner

ION ENERGY CONTROL ON ELECTRODES IN A PLASMA REACTOR

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards 2 nm, the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. Traditionally RF substrate biasing methods, which use sinusoidal RF waveforms to excite the plasma and form the plasma sheath, have bimodal ion energy distributions at the electrodes.

Therefore, there is a need in the art for a source and biasing methods that are able to produce a monoenergetic ion energy peak and accurately control ion energy distributions. Accordingly, such method and technique enable the completion of a desirable plasma-assisted process on a substrate, which are critical in thin film etching and deposition applications.

SUMMARY

Embodiments provided herein generally include apparatus, plasma processing systems and methods for controlling ion energy distribution in a processing chamber.

One embodiment of the present disclosure is directed to a method for plasma processing. The method generally includes: determining a voltage and/or power associated with a bias signal to be applied to a first electrode of a processing chamber, the voltage and/or power being determined based on a pressure inside a processing region of the processing chamber such that the voltage is insufficient to generate a plasma inside the chamber by application of the voltage to the first electrode; applying the first bias signal in accordance with the determined voltage to the first electrode; and applying a second bias signal to a second electrode of the processing chamber, wherein the second bias signal is configured to generate a plasma in the processing region and the first bias is applied while the second bias is applied. In some embodiments, the voltage and/or power is determined based on the pressure for a particular gap inside the processing region of the processing chamber, the gap being between either the first electrode and the second electrode or the first electrode and a grounded surface that defines at least a portion of the processing region.

One embodiment of the present disclosure is directed to an apparatus for plasma processing. The apparatus generally includes: a first source voltage generator configured to apply a first bias signal to a first electrode of a processing chamber in accordance with a voltage and/or power determined based on a pressure inside a processing region of the processing chamber such that the voltage and/or power is insufficient to generate a plasma inside the chamber by application of the voltage to the first electrode; and a second source voltage generator configured to apply a second bias signal to a second electrode of the processing chamber.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

DETAILED DESCRIPTION

Some embodiments of the present disclosure are generally directed to techniques for controlling ion energy distribution (IED) at an electrode in a plasma reactor. To achieve a monoenergetic IED, a pulsed signal may be provided to an upper electrode of a processing chamber for generating a plasma inside the chamber. Moreover, a continuous wave (CW) signal may be provided to a bottom or edge electrode (s) of the processing chamber. In this manner, a monoenergetic peak may be generated, facilitating precise plasma processing, so long as the power associated with the CW signal is below a power threshold. In other words, the voltage and/or power of the CW signal is selected to be below a threshold such that the voltage and/or power of the CW signal is insufficient for generating plasma due to the application of the CW signal to avoid generating multiple IED peaks.

In some embodiments, various signal parameters may be adjusted to control the IED. For example, the duty cycle of the pulsed signal may be determined based on a tradeoff between ion energy and ion energy distribution magnitude. The tradeoff is characterized by a greater IED magnitude and a lower ion energy, associated with increasing the duty cycle. Thus, the duty cycle associated with the pulsed signal provided to the upper electrode may be adjusted in accordance with this tradeoff. If a lower duty cycle is selected, resulting in a lower IED magnitude, such lower IED magnitude may be compensated for using any suitable techniques, such as increasing the power associated with the pulsed signal, increasing processing time, or increasing the pressure inside the chamber.

Plasma Processing System Examples

Figure 1:
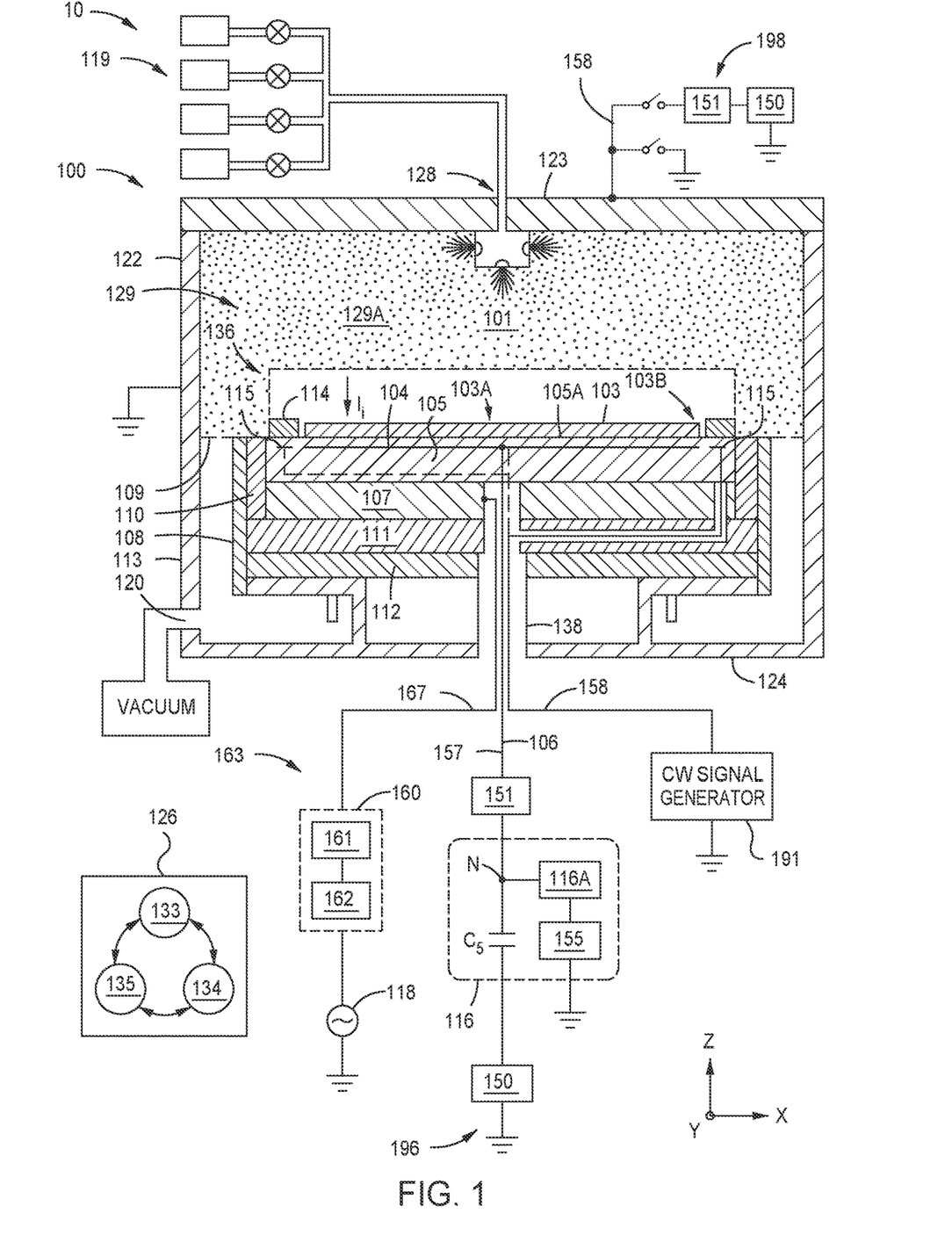
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing systems 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 includes an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode, and delivers an RF signal configured to ignite and maintain a plasma (e.g., the plasma 101). In this configuration, the plasma is capacitively coupled to each of the upper and lower electrodes and is disposed in a processing region therebetween. Typically, the opposing one of the upper or lower electrodes is coupled to ground or to a second RF power source. In one embodiment, one or more components of the substrate support assembly 136, such as the support base 107 is electrically coupled to a plasma generator assembly 163, which includes the RF generator 118, and the chamber lid 123 is electrically coupled to ground. As shown, the processing system 10 includes a processing chamber 100, a support assembly 136, and a system controller 126. In some embodiments, a plasma may alternately be generated by an inductively coupled source on top of the substrate (or a peripheral coil). In this configuration, a coil may be placed on top of a ceramic lid (vacuum boundary) and powered by an RF generator 118 to generate a plasma 101 in the processing volume 129 of the processing system 10.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 6.

The processing system may include a plasma generator assembly 163, a first source assembly 196 for establishing a first PV waveform at a bias electrode 104. In some embodiments, the plasma generator assembly 163 delivers an RF signal to the support base 107 (e.g., power electrode or cathode) which may be used to generate (maintain and/or ignite) a plasma 101 in a processing region disposed between the substrate support assembly 136 and the chamber lid 123. In some embodiments, the RF generator 118 is configured to deliver an RF signal having a frequency that is greater than 1 MHz or more, or about 2 MHz or more, such as about 13.56 MHz or more. In one example, the RF generator 118 is configured to deliver an RF signal having a frequency that is between about 13.56 MHz and about 200 MHz, such as between about 40 MHz and about 60 MHz.

As discussed above, in some embodiments, the plasma generator assembly 163, which includes an RF generator 118 and an RF generator assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. The RF power delivered to the support base 107 is configured to ignite and maintain a processing plasma 101 containing processing gases disposed within the processing volume 129. Configurations that provide RF power to the support base 107 to generate the plasma 101 will typically include a configuration where the chamber lid 123 is grounded.

In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of a waveform generator 150 from flowing through an RF power delivery line 167 and damaging the RF generator 118. The first filter assembly 161 acts as a high impedance (e.g., high Z) to the waveform generated by the waveform generator 150, and thus inhibits the flow of current to the RF matching circuit 162 and RF generator 118.

In some embodiments, the RF generator assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes ESC clamping voltage compensation circuit elements 116A, a DC power supply 155, and a ESC clamping voltage compensation module blocking capacitor, which is also referred to herein as the blocking capacitor $C_5$. The blocking capacitor $C_5$ is disposed between the output of a pulsed voltage (PV) waveform generator 150 and the bias electrode 104.

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

A power delivery line 157 electrically connects the output of the waveform generator 150 of the first source assembly 196 to an optional filter assembly 151 and the bias electrode 104. While the discussion below primarily discusses the power delivery line 157 of the first source assembly 196, which is used to couple a waveform generator 150 to the bias electrode 104, the power delivery line 158 of the second source assembly 198, which couples a waveform generator 150 to an upper electrode (e.g., chamber lid 123), will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the waveform generator 150. The optional filter assembly 151 acts as a high impedance (e.g., high Z) to RF signal generated by the RF generator 118, and thus inhibits the flow of current to the waveform generator 150.

In some embodiments, a CW signal generator 191 may be included within a waveform generator 150 to generate a CW signal at the output thereof. The CW signal, such as a sinusoidal RF signal, may be applied to one or more electrodes of the processing chamber 100, such as the electrode 104, edge electrode 115, or any combination thereof. In one example, the CW signal generator 191 is configured to deliver an RF signal having a frequency that is greater than 1 MHz, such as between about 13.56 MHz and about 200 MHz, such as between about 40 MHz and 60 MHz.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Figure 2:
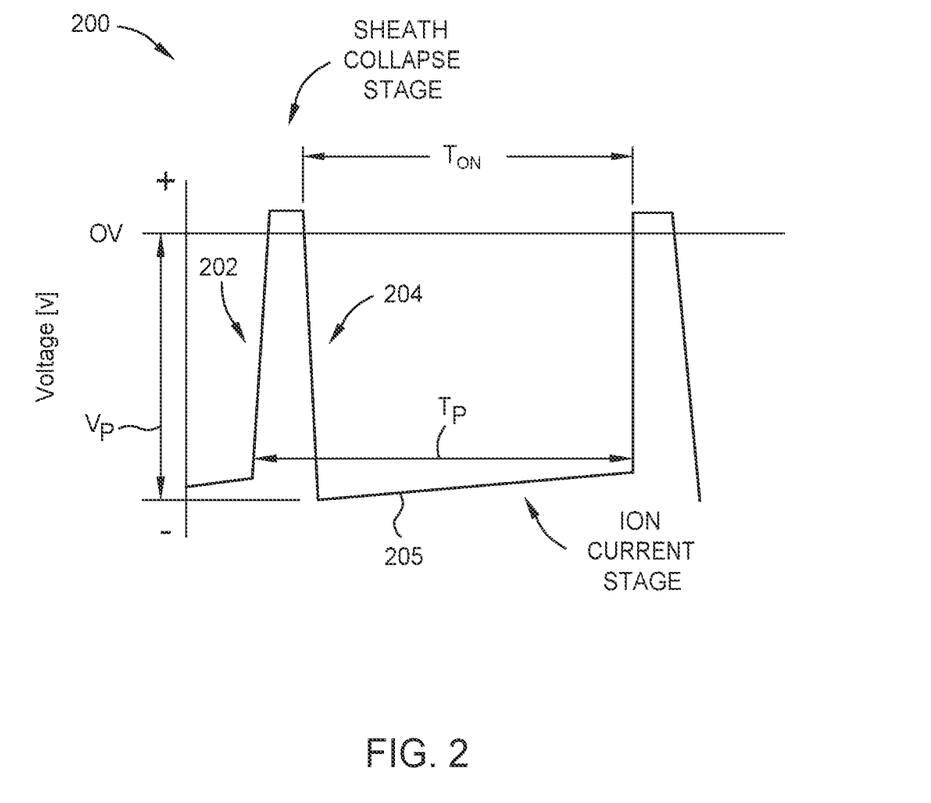
FIG. 2 shows a voltage waveform that is established on a substrate due to a voltage waveform applied to an electrode of a processing chamber.

FIG. 2 illustrates an example voltage waveform 200 established at a substrate in a processing chamber (e.g., processing chamber 100). In this example, the waveform 200 is generated due to the application of a waveform by the waveform generator 150 of the second source assembly 198 to one of the electrodes within the processing chamber 100, such as the bias electrode 104 and/or edge electrode 115. The waveform 200 includes an ion current stage and a sheath collapse stage, as shown. At the beginning of the ion current stage, a drop of substrate voltage, which is created by the falling edge 204, creates a high voltage sheath to form above the substrate, accelerating positive ions to the substrate. The positive ions that bombard the surface of the substrate during the ion current stage deposit a positive charge on the substrate surface, which, if uncompensated, causes a gradual increase of the substrate voltage positively (i.e., positive slope during phase 205 of the voltage waveform 200) during the ion current stage, as shown. However, the uncontrolled accumulation of positive charge on the substrate surface undesirably gradually discharges the sheath and chuck capacitors, slowly decreasing the sheath voltage drop and bringing the substrate potential closer to zero. The accumulation of positive charge results in the voltage droop (i.e., positive slope during phase 205) in the voltage waveform established at the substrate. The voltage difference between the beginning and end of the ion current phase determines an ion energy distribution function (IEDF) width. The greater the voltage difference, the wider the IEDF width.

During a portion of the voltage waveform, plasma bulk electrons are attracted to the substrate surface due to the rising edge 202 of the pulse step, but those electrons cannot establish a negative DC sheath potential yet as there are equal amounts of positive charge on the electrode (e.g., electrode 104). The substrate and the dielectric disposed between the electrode and the substrate supporting surface 105A form a capacitor, which has an effective capacitance $C_{esc}$, which will allow an equal amount of positive charge on the electrode to cancel the field generated by the electrons disposed on the substrate surface. At the falling edge 204 of the pulse step, the positive charge on the electrode is neutralized by the electrons from the waveform generator, and therefore, a negative DC voltage is established on the substrate surface. If the formed DC voltage is held constant, then mono-energy ion bombardment is achieved. The negative DC voltage (Vdc) can be approximated by using the magnitude of the falling edge (ΔV) and the ratio between the $C_{esc}$ and the sheath capacitance $C_{sheath}$ in accordance with the following equation:

$$Vdc = \Delta V * C_{esc}/(C_{esc} C_{sheath})$$

Technique for Waveform Generation

As device dimensions are scaling down below 5 nm, accurate ion energy control is becoming more important in thin film etching and deposition applications. The aspects described herein present methods and systems for ion energy control on one or more electrodes in a plasma reactor. In some embodiments, an ion energy control method is adopted with an active control module, in order to achieve selectivity, film quality and edge profile control, especially at or near an edge of the substrate disposed within the plasma chamber. Some embodiments facilitate achieving a narrow width monoenergetic ion energy distribution (IED) on electrodes. The position and width of the peak energy can also be controlled precisely, as described in more detail herein.

Figure 3A:
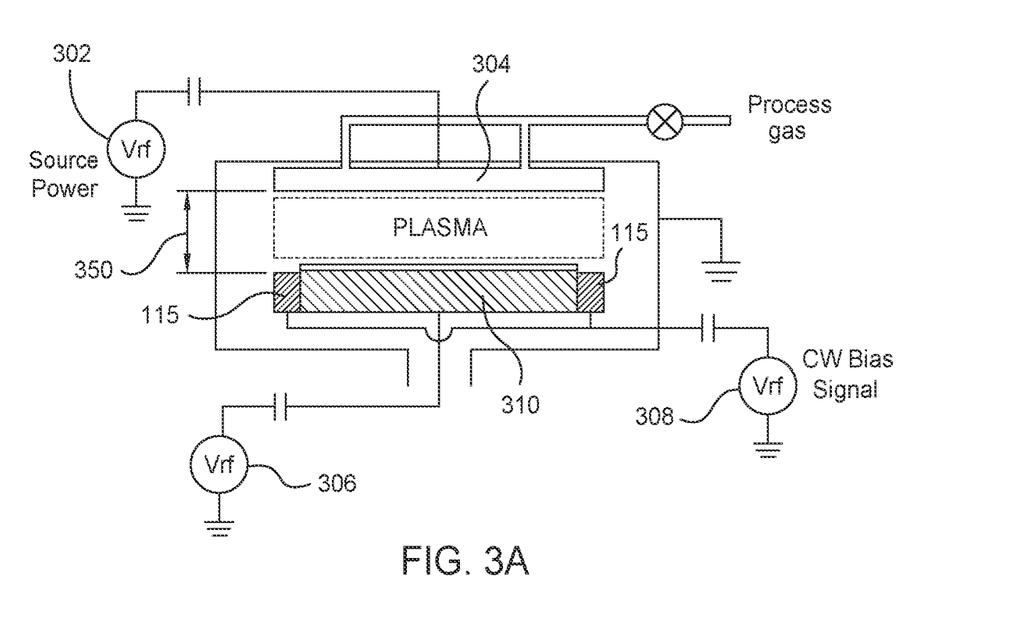
FIG. 3A illustrates RF sources providing bias signals to an upper electrode and edge electrodes of a processing chamber, in accordance with certain embodiments of the present disclosure.

FIG. 3A illustrates RF sources providing bias signals to an upper electrode 304 (e.g., corresponding to chamber lid 123 of FIG. 1), bias electrode(s) 104 and edge electrodes (e.g., edge electrode 115 of FIG. 1) of a processing chamber, in accordance with certain embodiments of the present disclosure. For example, a source RF generator 302 (e.g., corresponding to the source assembly 198) may generate a pulsed signal provided to the upper electrode 304. In some embodiments, a RF source power is applied via the source RF generator 302 to the upper electrode (e.g., chamber lid 123) for plasma production. The frequency of the RF source power may be from 13.56 MHz to a high frequency band such as around 200 MHz. As a few examples, the frequency of the RF source power may be 60 MHz, 120 MHz, or 162 MHz. The pulsing frequency of the source power may be from 100 Hz to 5 kHz and the duty cycle associated with the pulsing may range from 5% to 95%.

In some examples, the RF source power can also be delivered via a bottom electrode (e.g., electrode 104) by use of the waveform generator 150. For example, the voltage generator 306 may be part of the first source assembly 196 described with respect to FIG. 1, and may provide a RF source power to the bottom electrode 310 (e.g., corresponding to electrode 104 of FIG. 1). For example, the voltage generator 306 may apply a bias power the bottom electrode 310 (e.g., electrode 104 of FIG. 1) with a frequency range from 100 kHz to 60 MHz. The bias power may be operated in either a continuous or a pulsed mode. In one example, an RF waveform is provided to the electrode 310 by the first source assembly 196, and thus is different from the voltage waveform 200 discussed above in relation to FIG. 2. The RF waveform may be provided by the CW signal generator 191, which is discussed above.

In some embodiments of the present disclosure, a CW signal generator 308 may generate a continuous wave (CW) bias signal which may be provided to the edge electrode 115, as shown. The CW signal generator 308 may include the CW signal generator 191 described with respect to FIG. 1. The CW signal allows control of ion energy distribution on edge electrodes in a plasma processing chamber. In other words, a low-frequency RF power in the frequency range of 50 kHz to 2 MHz may be delivered to one or more edge electrodes and sourced in a continuous mode. That is, the bias signals applied to the one or more edge electrodes may be RF type continuous wave (CW) signals.

While the discussion herein primarily discloses the use of RF sources that are configured to provide a continuous wave (CW) signal (e.g., CW bias signal), such as the generators 306 or 308, this configuration is not intended to be limiting as to the scope of the disclosure since the RF sources could also be replaced by a source that supplies a pulse voltage waveform. In one example, one or more of the generators 306 and 308 can be configured to deliver, or replaced by a waveform generator that is configured to deliver, a pulsed voltage waveform similar to the waveform 200 illustrated in FIG. 2.

In order to achieve a monoenergetic ion energy distribution, the signal applied to the edge electrode may be set to be within a power range, as described in more detail herein. For example, the power of a bias signal applied to an electrode may be set within a voltage and/or power range (e.g., below a power threshold) such that the bias voltage and/or power is insufficient for plasma excitation due to the application of the CW bias signal, or pulsed voltage waveform. Surprisingly, it has been found that a monoenergetic ion energy distribution can be achieved at an electrode, such as the edge electrode in this process regime. Setting the power to be below the power threshold may involve setting the voltage of the CW bias signal to be below a voltage threshold, in some embodiments. In some embodiments in which a pulsed waveform is used, the maximum voltage provided during the delivery of the pulsed waveform to the electrode during processing, or peak voltage $V_p$ (FIG. 2) of the pulsed waveform, is maintained below the desired threshold voltage.

In the configuration illustrated in FIG. 3A, a CW bias signal is provided to the edge electrode 115 via the CW signal generator 308 and the voltage generator 306 is configured and adapted to apply a bias signal to the bottom electrode 310. In one embodiment, the voltage generator 306 is configured to apply a pulsed voltage waveform to the bias electrode 104 and the CW signal generator 308 is configured to apply a CW bias signal to the edge electrode 115. In another embodiment, the voltage generator 306 is configured to apply an RF waveform to the bias electrode 104 and the CW signal generator 308 is configured to apply a bias signal to the edge electrode 115, such as a CW bias signal. In another embodiment, the voltage generator 306 is configured to apply a bias signal that includes a pulsed voltage waveform to the bias electrode 104 and the CW signal generator 308 is configured to apply a bias signal that includes a pulsed voltage waveform to the edge electrode 115. In yet another embodiment, the voltage generator 306 is configured to apply a bias signal that includes a CW bias signal to the bias electrode 104 and the CW signal generator 308 is configured to apply a bias signal that includes a pulsed voltage waveform signal to the edge electrode 115. In any of these possible embodiments, the power of the CW bias signal or the pulsed voltage waveform may be set within a voltage and/or power range (i.e., below a voltage or power threshold) such that the bias power is insufficient for plasma excitation due to the application of the CW bias signal or the pulsed voltage waveform.

Figure 3B:
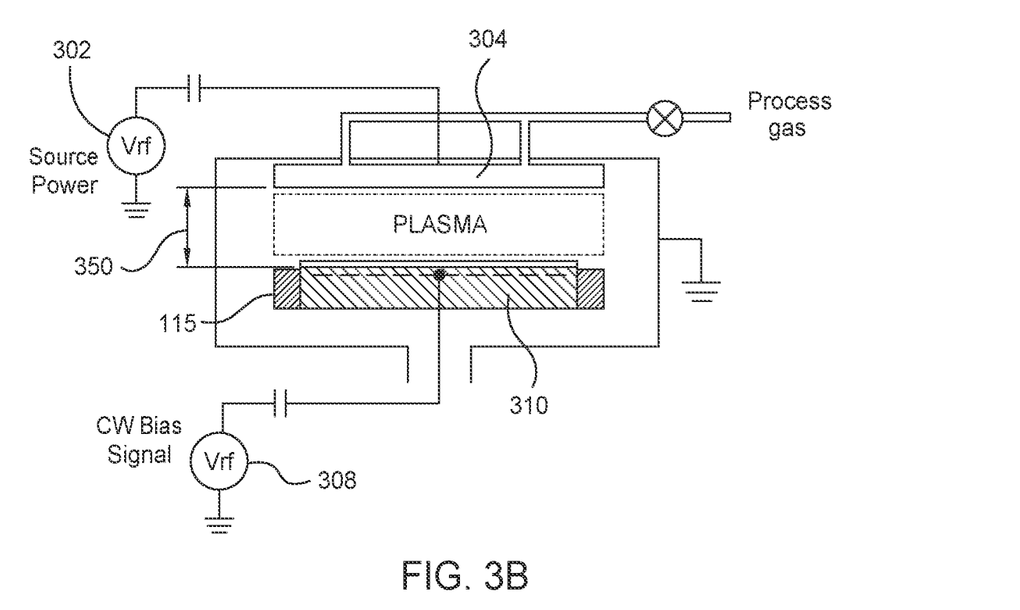
FIG. 3B illustrates RF sources providing bias signals to an upper electrode and a bottom electrode of a processing chamber, in accordance with certain embodiments of the present disclosure.

FIG. 3B illustrates voltage sources providing bias signals to an upper electrode and a bottom electrode of a processing chamber, allowing for monoenergetic ion energy distribution control in a plasma processing chamber. As shown, source RF generator 302 may provide the RF source power to the upper electrode 304 for plasma production. In some examples, the RF source power may be provided to a bottom electrode (e.g., bias electrode 104 or support base 107). In other examples, the RF source power may be provided to an inductively coupled plasma (ICP) source electrode.

In the configuration illustrated in FIG. 3B, a CW bias signal may be provided to the bottom electrode 310 (e.g., bias electrode 104 or support base 107 of FIG. 1) via the CW signal generator 308. The power of the CW bias signal, or pulsed voltage waveform, may be set within a power range such that the bias power is insufficient for plasma excitation due to the application of the bias signal. A monoenergetic ion energy distribution can be achieved at the bottom electrode in this process regime. As used herein, an electrode that is provided a CW bias signal, or pulsed voltage waveform, is generally referred to as a CW electrode, such as the edge electrode 115 or the bottom electrode 310. For ease of discussion, while a bias signal applied to an electrode is primarily referred to below as a CW bias signal, it should be understood that the CW bias signal could be replaced by a pulsed voltage waveform.

Figure 4:
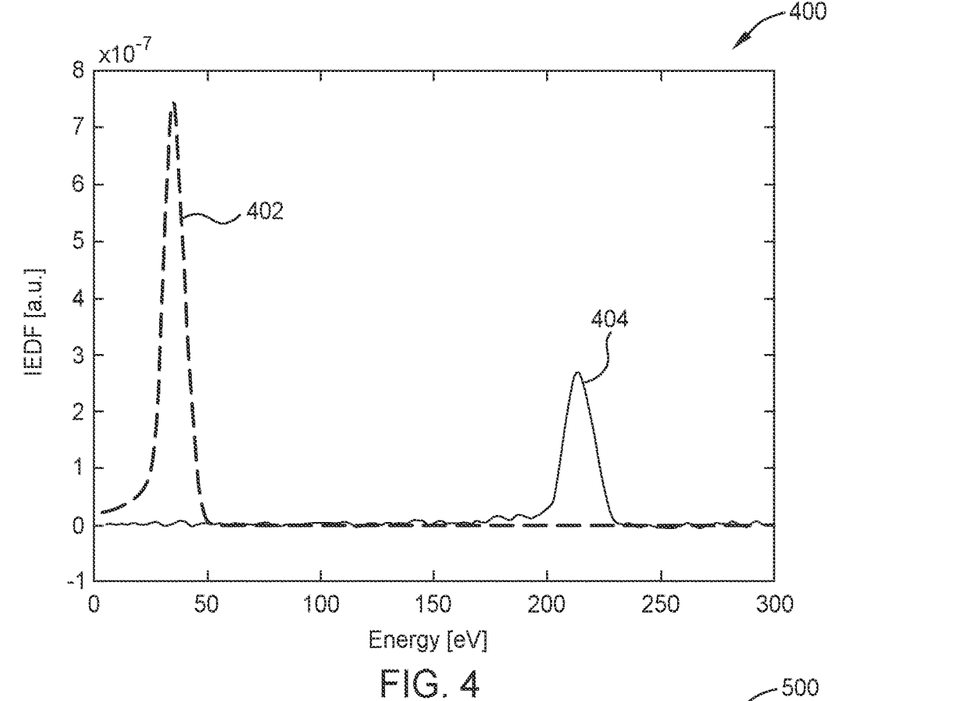
FIG. 4 is a graph showing an ion energy distribution (IED) comparison at an electrode with different operation modes, in accordance with certain embodiments of the present disclosure.

FIG. 4 is a graph 400 showing IEDs at a CW electrode with different operation modes. When all RF powers (source and bias) are operated in a CW mode, IED 402 measured on the CW electrode has a low energy peak. A preferable single peak IED 404 at a higher energy is achieved on the CW electrode when the source power (e.g., from the source RF generator 302) is pulsed. For comparison purposes, RF signal from the source RF generator that was used to generate the lower energy IED peak, was maintained at a first power level and in continuous mode (100% duty cycle), whereas RF signal, used to generate the higher IED peak, was provided at the same power level and operated in the pulsed mode with a duty cycle from 0% to 100%. One will note that the IED shifts towards higher energy if a higher bias power is used at the CW electrode.

Figure 5:
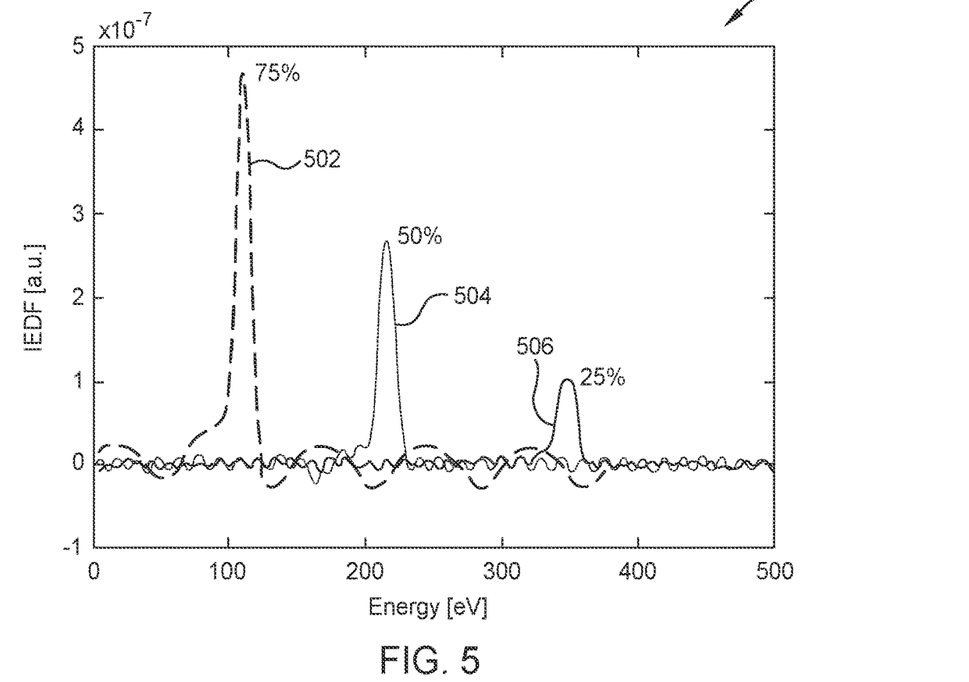
FIG. 5 is a graph showing an IED comparison at an electrode with different source power duty cycles, in accordance with certain embodiments of the present disclosure.

FIG. 5 is a graph 500 showing an IED comparison at the CW electrode with different pulsed source power duty cycles. As described, the source power from the source RF generator 302 may be pulsed. The pulsed signal may be set to different duty cycles (e.g., 25%, 50%, and 75%). A narrower IED on the CW electrode may be achieved with a longer source power duty cycle. In other words, the IED (e.g., associated with peak 502) is narrower for the 75% duty cycle as compared to the IED (e.g., associated with peak 506) for the 25% duty cycle. On the other hand, a higher ion energy single peak 506 can be desirably achieved with a shorter source power duty cycle (e.g., 25% duty cycle).

Figure 6:
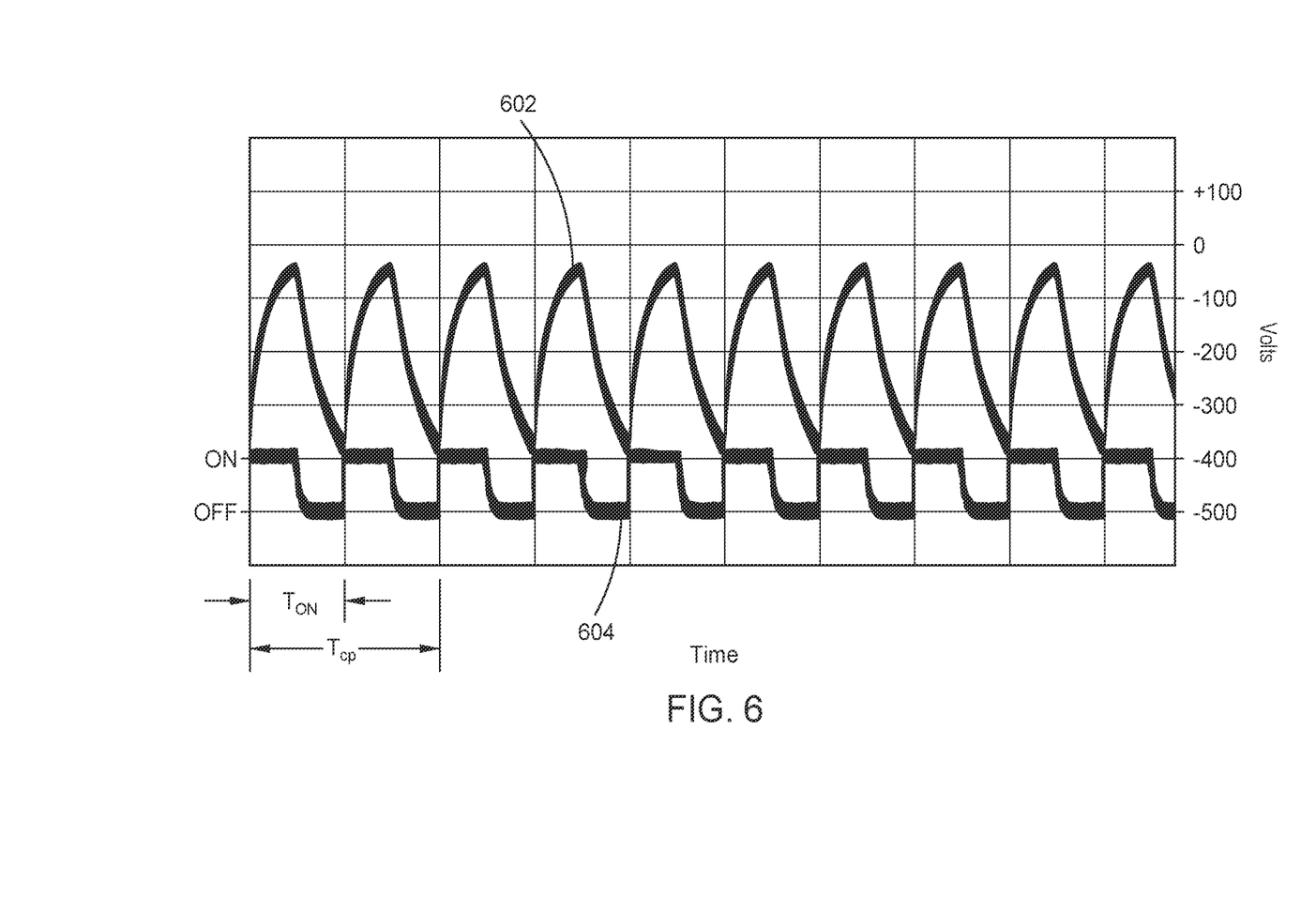
FIG. 6 illustrates a voltage waveform as measured on an electrode and a pulsing signal provided by a source voltage generator, according to certain embodiments of the disclosure.

FIG. 6 illustrates a voltage waveform 602 as measured on the CW electrode and a pulsing signal 604 (e.g., pulsed RF signal) provided by the source RF generator 302 to an electrode, such as the electrode 304. As shown, the source power is in pulsed mode and CW bias power is in CW mode. When the source power is off, the voltage on the CW electrode becomes increasingly negative, resulting in a high energy monoenergetic IED. In other words, the longer the pulsing signal 604 is off, the more negative the voltage on the CW electrode will become, resulting in a higher energy as shown by graph 500 of FIG. 5. Therefore, as shown in FIG. 5, for a 25% duty cycle pulsing signal (e.g., where the pulsing signal is off for 75% of the period of the pulsing signal), the resulting peak is associated with a higher energy yet has a lower IED magnitude.

The power supplied to the CW electrode may be set to a specific constant power to implement a monoenergetic IED. As shown in FIG. 5, the peak 502 associated with a 75% duty cycle has a higher magnitude than peak 504 associated with a 50% duty cycle, and the peak 504 has a higher magnitude than peak 506 associated with a 25% duty cycle. To implement a monoenergetic IED, the power supplied by the CW bias signal generator may be set to be below a certain power threshold (or voltage threshold). The threshold may be set based on various factors such as the pressure, gap (e.g., gap 350 in FIGS. 3A-3B) between electrodes, and chemistries associated with the chamber, as described in more detail with respect to FIG. 7A.

Figure 7A:
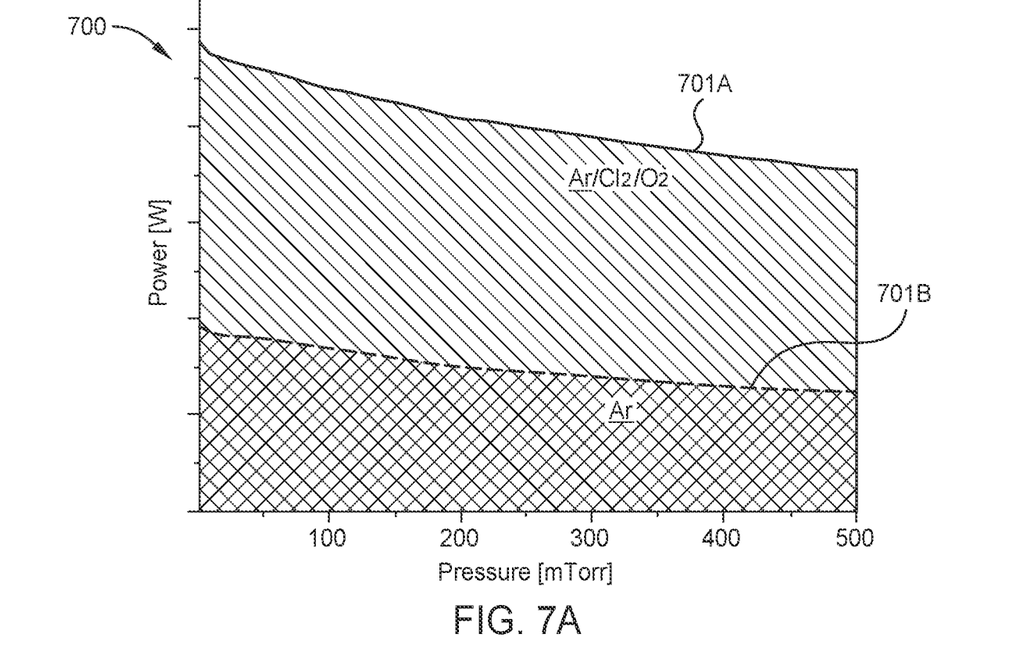
FIG. 7A includes curves that illustrate a desirable power range associated with a continuous wave (CW) signal provided to an electrode for use with different pressures and process chemistries, in accordance with certain embodiments of the present disclosure.

FIG. 7A is an example of a graph 700 that includes one or more power range curves 701A-701B that illustrate a power range associated with the CW bias signal under different process pressures and using different process chemistries for a given processing chamber 100 configuration. The power supplied to the CW electrode is within a range where RF power is insufficient for plasma excitation. In one embodiment, as illustrated in FIG. 7A, the graph 700 includes two curves that each illustrate the maximum power that can be applied to an electrode for a given process chemistry as a function of processing pressure that can be applied to the electrode in a known chamber configuration and not generate a plasma. In alternate embodiments, the graph 700 may include a curve that illustrates a maximum voltage that can be applied to an electrode for a known process chemistry as a function of processing pressure that can be applied to the electrode in a known chamber configuration and not generate a plasma. As shown in FIG. 7A, a higher RF power can be applied to the CW electrode at a lower pressure to avoid the generation of a plasma by the delivery of the CW bias signal. Electronegative process chemistries, for example argon (Ar)/chlorine (Cl$_2$)/dioxygen (O$_2$), can operate at higher powers before plasma excitation occurs, as compared to the Ar chemistries. Moreover, the pressure range may be from 1 mTorr to 500 mTorr. The power threshold (e.g., voltage threshold) that is insufficient for plasma excitation may also depend on a gap formed between the CW electrode and a grounded surface or counter electrode disposed in the chamber. For example, referring back to FIG. 3B, a gap 350 may exist between a CW electrode (e.g., electrode 310 or electrode 115) to which a CW signal is applied and the upper electrode 304 to which the source power is applied. Thus, the CW signal's power (or voltage) may be determined for a particular gap 350 as described. In some embodiments, the gap 350 may be adjusted prior to or during processing by use of an actuator (not shown), or other adjustable mounting hardware, that is configured to position the CW electrode at a desired location within the processing volume.

Figure 7B:
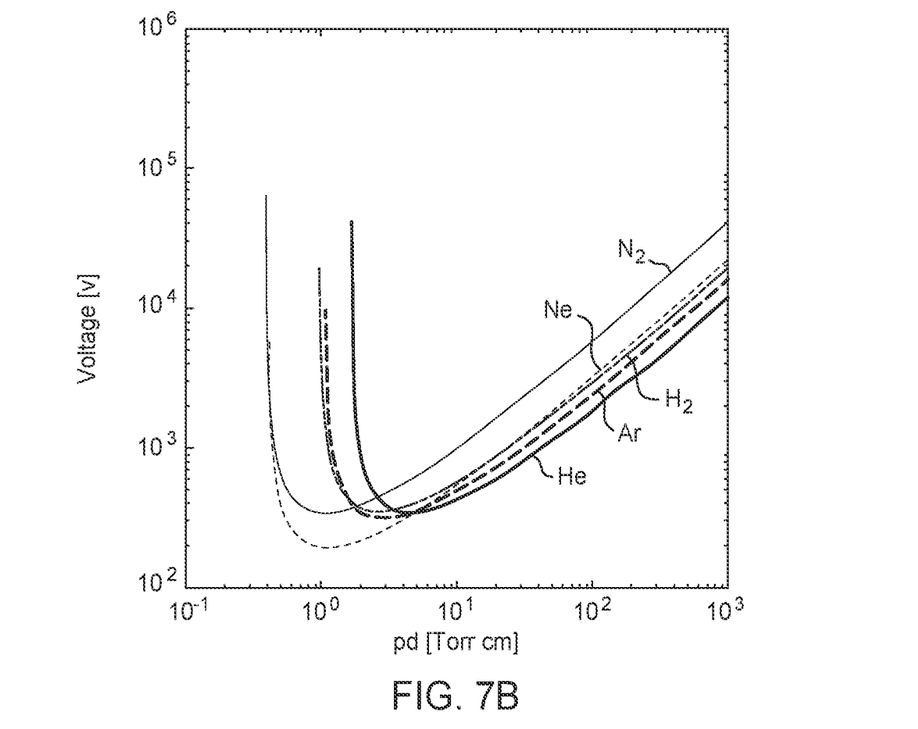
FIG. 7B illustrates Paschen's curves generated for common gases.

In some embodiments, the limit on the power provided to a CW electrode to avoid the generation of a plasma due to the delivery of CW signal can be determined for a given process chemistry and chamber configuration by experimentally generating a Paschen's curve over a desired process regime and then maintaining the process parameters during processing at a level below a point where a plasma will be generated. An example of five different Paschen's curves generated for common gases is illustrated in FIG. 7B. However, the characteristics of a Paschen's curve depend on the process chemistry and chamber configuration, and thus will need to be generated as one or more of the chamber configuration and process chemistry parameters are varied. It is believed that by staying below a voltage level at a given pressure times gap distance (e.g., "pd" in Torr-cm in FIG. 7B) that is defined by a generated Paschen's curve for a given gas chemistry one can be assured that an arc and thus plasma will not be generated due to the signal provided to the CW electrode.

Based on the creation of curves that are the same as or similar to the ones illustrated in FIG. 7A, or generated Paschen's curve similar to the ones shown in FIG. 7B, the system controller 126 for a given plasma processing recipe (e.g., CW provided power, gas composition, chamber configuration) that is to be executed during a plasma processing process can be used to control and/or limit the power provided to the CW electrode to assure that the applied voltage and/or power stays below a level that will generate a plasma in the processing volume. As discussed above, the controlled or limited voltage and/or power that is applied can be provided by the delivery of a CW bias signal or a pulsed voltage waveform from the CW signal generator 308. However, the controlled or limited voltage and/or power that is applied can also be provided by one or more of the generators 306 and 308.

In an effort to desirably control the results of a plasma process, the duty cycle of the source power (e.g., the pulsed signal generated by the source RF generator 302) may be determined based on a tradeoff between ion energy and ion energy distribution magnitude. The tradeoff is characterized by a greater ion energy distribution magnitude and a lower ion energy, associated with increasing the duty cycle, as described with respect to FIG. 5. For example, a lower duty cycle (e.g., 25%) may be selected to obtain a higher energy, yet with a tradeoff of a lower ion energy magnitude, as shown by graph 500.

The lower duty cycle magnitude may be compensated for using any suitable technique. Such a technique may include increasing the source power (e.g., power of pulsed signal generated by the source RF generator 302), increasing processing time, increasing the pressure inside the chamber, or any combination thereof. Embodiments described herein allow for a narrow width monoenergetic IED on the CW electrodes for uniformity control. The single IED peak can be controlled by power delivered to the CW electrode and the duty cycle of the pulsed source power.

Figure 8:
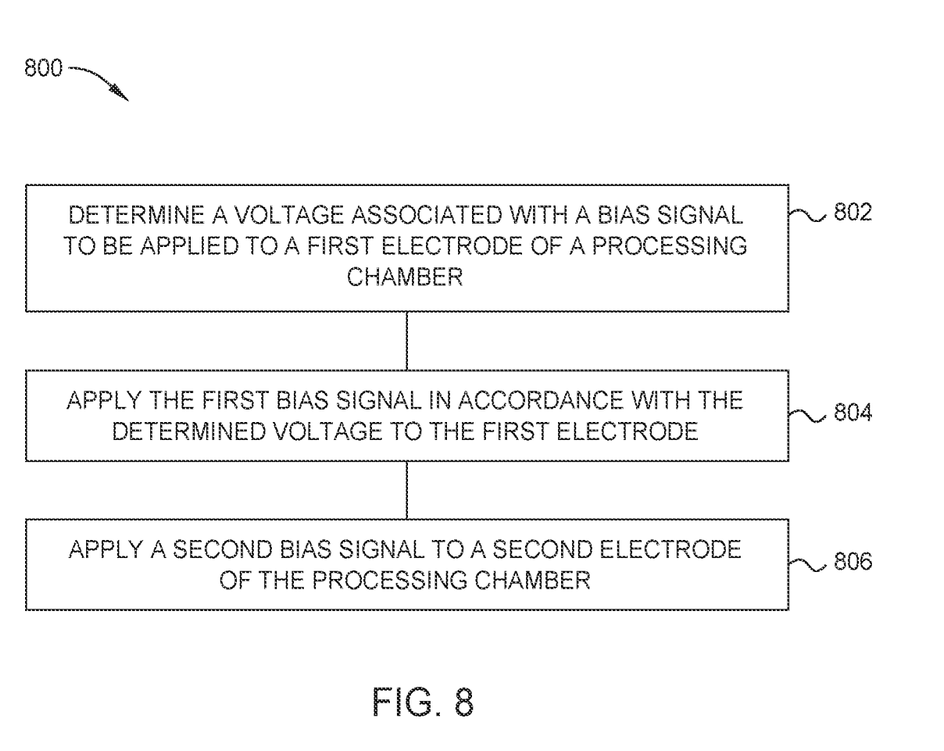
FIG. 8 is a process flow diagram illustrating a method for plasma processing, in accordance with certain embodiments of the present disclosure.

FIG. 8 is a process flow diagram illustrating a method 800 for plasma processing. Method 800 may be performed by a processing system. The processing system may include voltage generation components (e.g., source assembly 196, 198 and CW signal generator 191) and a system controller such as the system controller 126.

Method 800 begins, at activity 802, with the processing system determining a voltage and/or power associated with a bias signal to be applied to a first electrode of a processing chamber. In one configuration, the first electrode is a CW electrode, such as the bias electrode 104, edge electrode 115, or any combination thereof. The voltage and/or power may be determined based on the chamber configuration, gas composition and a pressure inside a processing region of the processing chamber such that the voltage is insufficient to generate a plasma inside the chamber by application of the voltage to the first electrode. In some embodiments, the voltage and/or power can be determined by comparing process recipe parameters (e.g., gas composition, process pressure set point(s), and electrode spacing(s) (e.g., gap)) with one or more of the curves illustrated in FIGS. 7A-7B for a desired process recipe and known chamber configuration. The comparison may be completed by comparing curve related information (e.g., power range curve (e.g., FIG. 7A) or Paschen's curve (e.g., FIG. 7B)) stored in the memory of the system controller 126 with the desired process recipe parameters.

At activity 804, the processing system applies the first bias signal (e.g., a CW signal) in accordance with the determined voltage and/or power to the first electrode, and at activity 806, applies a second bias signal (e.g., source power generated via source RF generator 302) to a second electrode of the processing chamber, where the second bias signal is configured to generate a plasma in the processing region and the first bias is applied while the second bias is applied. In some configurations, the second electrode is the upper electrode 304 (FIGS. 3A-3B) or the support base 107. The voltage or power applied to the first electrode is determined (e.g., at activity 802) based on the pressure for a particular gap formed inside the processing region of the processing chamber. The gap can be formed between the first electrode and the second electrode in a configuration where the first electrode and second electrode oppose each other, as illustrated in FIG. 3A-3B, or formed between the first electrode and a grounded surface used to define at least a portion of the processing volume 129 of the processing chamber 100 (e.g., chamber lid 123).

In some embodiments, the processing system further applies a third bias signal (e.g., a CW signal) to a third electrode of the processing chamber. The first electrode and the third electrode may be positioned within a substrate support assembly disposed within the processing region and a distance from a substrate supporting surface of the substrate support assembly. For example, the first electrode and the third electrode may be the edge electrode (e.g., edge electrode 115) and the chucking electrode (e.g., bias electrode 104), respectively.

In some embodiments, the voltage and/or power is further determined based on a gas composition disposed within the processing region of the processing chamber. As described herein, the voltage and/or power may be determined to be below a voltage and/or power threshold such that the voltage is insufficient to generate a plasma inside the chamber. For example, the voltage and/or power may be determined to be below a voltage and/or power threshold such that a monoenergetic peak is generated for the plasma processing.

In some embodiments, the second bias signal is a pulsed signal having an on period and an off period (e.g., as shown in FIG. 6). A duty cycle associated with the pulsed signal may be determined based on a tradeoff between ion energy and ion energy distribution magnitude associated with adjustments to the duty cycle. The tradeoff is characterized by a greater ion energy distribution magnitude and a lower ion energy, associated with increasing the duty cycle. As described, a voltage at the first electrode increases during the on period and decreases during the off period.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A method for plasma processing, comprising:
    determining a power associated with a first bias signal to be applied to a first electrode of a processing chamber, the power being determined based on a pressure inside a processing region of the processing chamber such that:
    the power s insufficient to generate a plasma inside the processing chamber by application of the power to the first electrode; and
    a second bias signal that exceeds the power when applied is sufficient to generate a monoenergetic peak; and
    performing a plasma-assisted etching process on processing a substrate using a plasma with a monoenergetic ion energy distribution, the plasma generated by:
    applying the first bias signal in accordance with the determined power to the first electrode; and
    applying the second bias signal to a second electrode of the processing chamber, wherein the second bias signal is configured to generate the plasma in the processing region and the first bias is applied while the second bias is applied.

2. The method of claim 1, wherein the power is determined based on the pressure for a particular gap inside the processing region of the processing chamber, the gap being between the first electrode and the second electrode or the first electrode and a grounded surface that defines at least a portion of the processing region.

3. The method of claim 1, further comprising applying a third bias signal to a third electrode of the processing chamber, wherein the first electrode and the third electrode are positioned within a substrate support assembly disposed within the processing region and a distance from a substrate supporting surface of the substrate support assembly.

4. The method of claim 1, wherein the first bias signal comprises a continuous wave (CW) signal.

5. The method of claim 1, wherein the power is further determined based on a gas composition disposed within the processing region of the processing chamber.

6. The method of claim 1, wherein the first electrode comprises an edge electrode of a substrate support assembly.

7. The method of claim 1, wherein the power is determined to be below a threshold such that the power is insufficient to generate the plasma inside the processing chamber.

8. The method of claim 1, wherein the second bias signal comprises a pulsed signal that comprises an on period and an off period, and a duty cycle associated with the pulsed signal is determined based on a tradeoff between ion energy and ion energy distribution magnitude associated with adjustments to the duty cycle.

9. The method of claim 8, wherein the tradeoff is characterized by a greater ion energy distribution magnitude and a lower ion energy, associated with increasing the duty cycle.

10. The method of claim 1, wherein the second bias signal comprises a pulsed signal that comprises an on period and an off period, and wherein a power at the first electrode increases during the on period and decreases during the off period.

11. An apparatus for plasma processing, comprising:
a memory having executable instructions; and
a controller configured to execute the executable instructions and perform a plasma-enhanced deposition process on process a substrate using a plasma with a monoenergetic ion energy distribution, the plasma generated by:
using a first source generator to apply a first bias signal to a first electrode of a processing chamber in accordance with a power determined based on a pressure inside a processing region of the processing chamber such that:
the power is insufficient to generate a plasma inside the processing chamber by application of the power to the first electrode; and
a second bias signal that exceeds the power when applied is sufficient to generate a monoenergetic peak; and
using a second bias generator to apply the second bias signal to a second electrode of the processing chamber and generate the plasma.

12. The apparatus of claim 11, wherein the voltage and/or power is determined based on the pressure for a particular gap inside the processing region of the processing chamber, the gap being between the first electrode and the second electrode or the first electrode and a grounded surface that defines at least a portion of the processing region.

13. The apparatus of claim 11, wherein the controller is configured to cause a third bias generator to apply a third bias signal to a third electrode of the processing chamber, wherein the first electrode and the third electrode are positioned within a substrate support assembly disposed within the processing region and a distance from a substrate supporting surface of the substrate support assembly.

14. The apparatus of claim 11, wherein the first bias signal comprises a continuous wave (CW) signal.

15. The apparatus of claim 11, wherein the power is further determined based on a gas composition disposed within the processing region of the processing chamber.

16. The apparatus of claim 11, wherein the first electrode comprises an edge electrode of a substrate support assembly.

17. The apparatus of claim 11, wherein the power is determined to be below a power threshold such that the power is insufficient to generate the plasma inside the processing chamber.

18. The apparatus of claim 11, wherein the second bias signal comprises a pulsed signal that comprises an on period and an off period, and a duty cycle associated with the pulsed signal is determined based on a tradeoff between ion energy and ion energy distribution magnitude associated with adjustments to the duty cycle, wherein the tradeoff is characterized by a greater ion energy distribution magnitude and a lower ion energy, associated with increasing the duty cycle.

* * * * *